United States Patent
Chung et al.

(10) Patent No.: US 9,040,423 B2
(45) Date of Patent: May 26, 2015

(54) METHOD FOR MANUFACTURING SEMICONDUCTOR DEVICE

(71) Applicant: UNITED MICROELECTRONICS CORP., Hsinchu (TW)

(72) Inventors: Wan-Fang Chung, Chiayi (TW);
Ping-Chia Shih, Tainan (TW);
Hsiang-Chen Lee, Kaohsiung (TW);
Che-Hao Chang, Tainan (TW);
Jhih-Long Lin, Pingtung County (TW);
Wei-Pin Huang, Kaohsiung (TW);
Shao-Nung Huang, Tainan (TW);
Yu-Cheng Wang, Tainan (TW);
Jaw-Jiun Tu, Kaohsiung (TW);
Chung-Che Huang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 13/943,900

(22) Filed: Jul. 17, 2013

(65) Prior Publication Data
US 2015/0024598 A1  Jan. 22, 2015

(51) Int. Cl.
*H01L 21/311* (2006.01)
*H01L 21/306* (2006.01)

(52) U.S. Cl.
CPC ........ *H01L 21/306* (2013.01); *H01L 21/31105* (2013.01); *H01L 21/30604* (2013.01)

(58) Field of Classification Search
CPC .................. H01L 21/30604; H01L 21/31105; H01L 21/31144; H01L 21/3185
USPC .......................... 438/694, 724, 725, 736, 744
See application file for complete search history.

(56) References Cited

U.S. PATENT DOCUMENTS

| | | | |
|---|---|---|---|
| 2005/0098821 A1* | 5/2005 | Chao et al. | 257/314 |
| 2007/0020565 A1 | 1/2007 | Koh et al. | |
| 2010/0130016 A1* | 5/2010 | DeVilliers | 438/703 |
| 2012/0252205 A1* | 10/2012 | Hotta et al. | 438/624 |

\* cited by examiner

*Primary Examiner* — Binh X Tran
(74) *Attorney, Agent, or Firm* — WPAT, PC; Justin King (57) ABSTRACT

A method for manufacturing a semiconductor device is provided. A substrate having a first area with a first poly layer and a second area with a second poly layer is provided. A nitride HM film is then deposited above the first poly layer of a first device in the first area and above the second poly layer in the second area. Afterwards, a first patterned passivation is formed on the nitride HM film in the first area to cover the nitride HM film and the first device, and a second patterned passivation is formed above the second poly layer in the second area. The second poly layer in the second area is defined by the second patterned passivation.

13 Claims, 8 Drawing Sheets

METHOD FOR MANUFACTURING SEMICONDUCTOR DEVICE

BACKGROUND

1. Technical Field

The disclosure relates in general to a method for manufacturing a semiconductor device, and more particularly to the method for manufacturing a semiconductor device with deposition of a nitride hard mask (HM) film to protect a cell gate from damage in the subsequent manufacturing procedures.

2. Description of the Related Art

Size of semiconductor device applied in the electronic product has been decreased for these years. Reduction of feature size, increase of resolution, improvements of the rate, the efficiency, the density and the cost per integrated circuit unit are the important goals in the semiconductor technology. The electrical properties of the device have to be maintained even improved with the decrease of the size, to meet the requirements of the commercial products in applications. If the layers and/or components of the device are damaged, it would have considerable effects on the electrical properties.

For high resolution requirement, the thickness of photoresist trend to thin down. An electronic product (such as flash product) may have two devices at different areas of the substrate, and the devices have different step height profiles on the substrate. In the manufacturing method, the upper polysilicon layer of a device such as flash gate could be damaged during etching process. Conventionally, two layers such as the first bottom anti-reflective coating (BARC) and the second BARC and the lithography processes thereof are applied above the polysilicon layer in the manufacturing method for preventing the upper poly from being damaged during etching process. Typically, the first BARC is remained to protect the poly in an non-pure logic area (flash/memory) on the substrate, and the second BARC is deposited on the 1st BARC. However, this would cause adhesion issue between the first BARC and second BARC. Also, the stack of the first BARC and second BARC may be too high to be remained in a stable condition, and would be collapsed easily. Those problems would have considerable effects on the electrical properties of the devices of the electronic product in application.

SUMMARY

The disclosure is directed to a method for manufacturing a semiconductor device, which a nitride hard mask (HM) film is further deposited for protecting a first device (such as the flash gate) in a first area (such as a non-pure logic area, or a flash/memory/cell area) from being damaged in the subsequent procedures, thereby improving yield and the electrical properties of the device.

According to the disclosure, a method for manufacturing a semiconductor device is provided. A substrate having a first area with a first poly layer and a second area with a second poly layer is provided. A nitride HM film is then deposited above the first poly layer of a first device in the first area and above the second poly layer in the second area. Afterwards, a first patterned passivation is formed on the nitride HM film in the first area to cover the nitride HM film and the first device, and a second patterned passivation is formed above the second poly layer in the second area. The second poly layer in the second area is defined by the second patterned passivation.

According to the embodiments, the nitride HM film in the first area could be removed before or after defining the polysilicon layer of the second device.

DETAILED DESCRIPTION

In the present disclosure, a method for manufacturing a semiconductor device with deposition of a nitride hard mask (HM) is provided to protect a first device (such as the flash gate) in a first area, such as a non-pure logic area, or a flash/memory/cell area, from being damaged in the subsequent procedures; for example, poly define procedures in a second area (such a pure logic area, gate area). Accordingly, the yield and electrical characteristics of the device manufactured using the method of the present disclosure have been greatly improved.

The embodiments are described in details with reference to the accompanying drawings. The identical and/or similar elements of the embodiments are designated with the same and/or similar reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

The present disclosure could be applied to a substrate having at least two devices with different step height profile. The manufacturing methods of the embodiments would be slightly different, and could be modified and changed according to the procedures in practical applications. According to the embodiments of the disclosure, the nitride (SiN/SiCN) HM film in the first area (such as non-pure logic area, or a flash/memory/cell area) could be removed before or after define of the second device (such as logic gate). Two embodiments are provided hereinafter with reference to the accompanying drawings for describing the related procedures, but the present disclosure is not limited thereto. It is noted that not all embodiments of the invention are shown. Modifications and variations can be made without departing from the spirit of the disclosure to meet the requirements of the practical applications.

First Embodiment

Figure 1A:
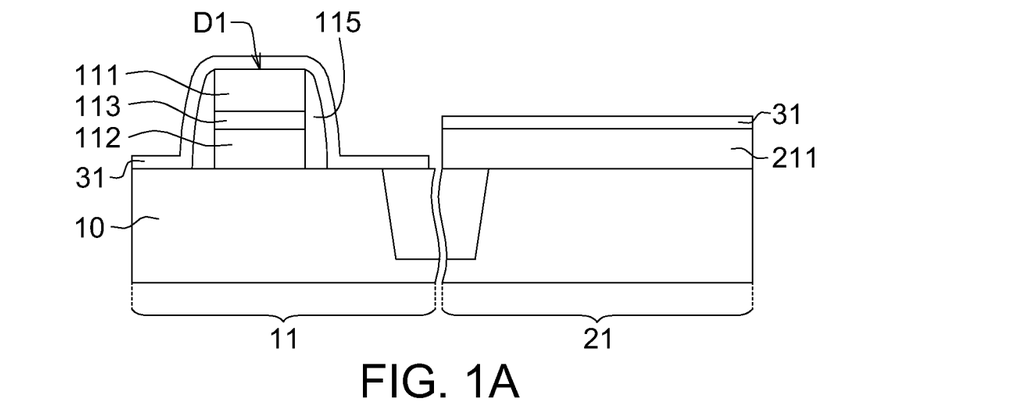
FIG. 1A~FIG. 1I schematically illustrate a method for manufacturing a semiconductor device according to a first embodiment of the present disclosure.

FIG. 1A~FIG. 1I schematically illustrate a method for manufacturing a semiconductor device according to a first embodiment of the present disclosure. First, a substrate 10 having a first area 11 and a second area 21 is provided, as shown in FIG. 1A. A first device D1 comprising a first polysilicon layer 111 is formed in the first area 11, while a second poly layer 211 is formed in the second area 21. According to the embodiment, the first area 11 could be referred to a non-pure logic area, a flash area, a memory area, or a cell area, which is an area for forming the first device D1. The second area 21 could be referred to a pure logic area, which is an area for forming a second device D2 such as logic gate. In the first embodiment, a flash gate structure is depicted for being the first device D1 of the first area 11, which comprises an upper poly silicon layer (i.e. the first polysilicon layer 111) as a control gate, a lower poly silicon layer 112 as a floating gate, a dielectric layer 113 (ex: oxide layer) disposed between, and spacers 115 formed at sidewalls of the stack. As shown in FIG. 1A, the first poly layer 111 and the second poly layer 211 have different heights.

In the first embodiment, an oxide hard mask (HM) film 31 is deposited on the first device D1 in the first area 11 and on the second poly layer 211 in the second area 21. As shown in FIG. 1A, the oxide HM film 31 covers the first polysilicon layer 111, the dielectric layer 113, the lower poly silicon layer 112 and the spacers 115.

Figure 1B:
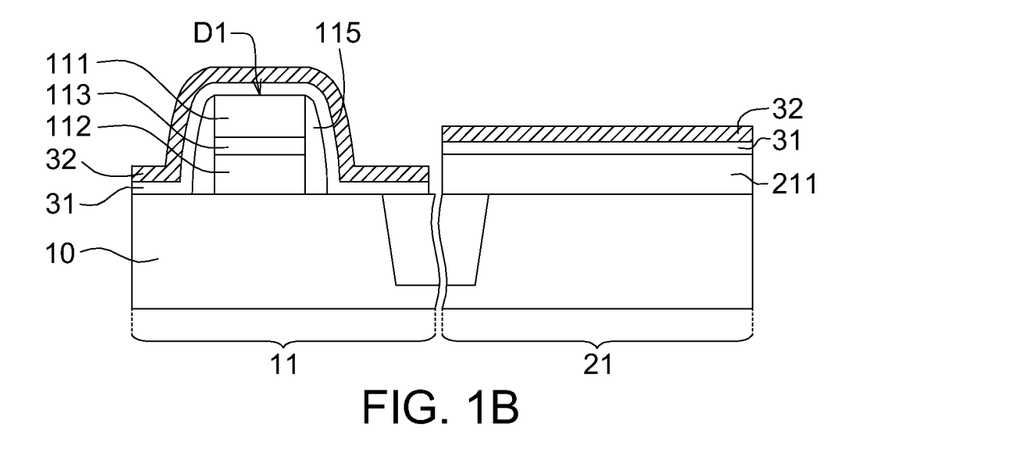

As shown in FIG. 1B, a nitride HM film 32 is deposited above the first poly layer 111 of the first device D1 in the first area 11 and above the second poly layer 211 in the second area 21. In the first embodiment, the nitride HM film 32 is deposited on the oxide HM film 31. Material examples of the nitride HM film 32 include SiN, SiCN, and the likes.

Then, a first patterned passivation is formed on the nitride HM film 32 of the first area 11 to cover the nitride HM film 32 and the first device D1, and a second patterned passivation is formed above the second poly layer 211 in the second area 21. Afterward, the second poly layer 211 is defined (ex: etching) in the second area 21 by the second patterned passivation. Also, before forming the first and second patterned passivations, other procedures could be adopted, and would be described as below.

Figure 1C:
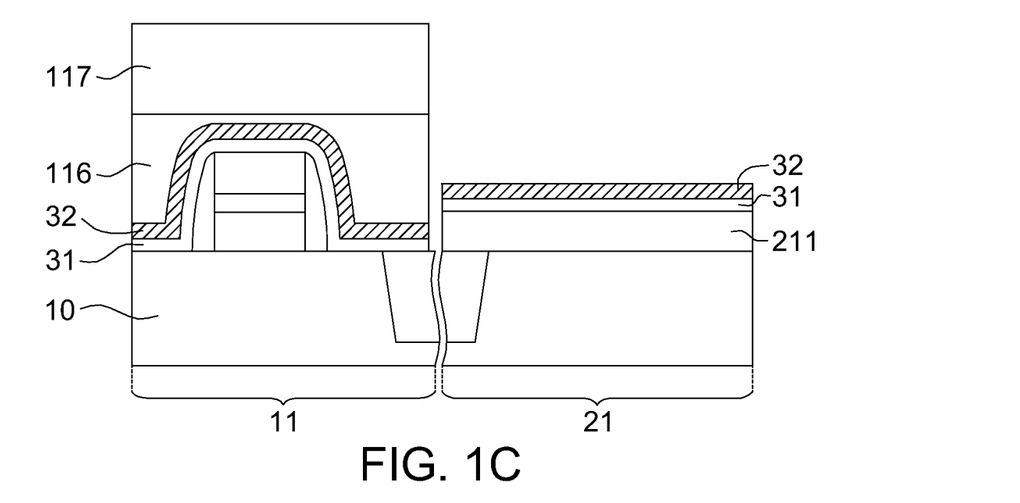
Figure 1D:
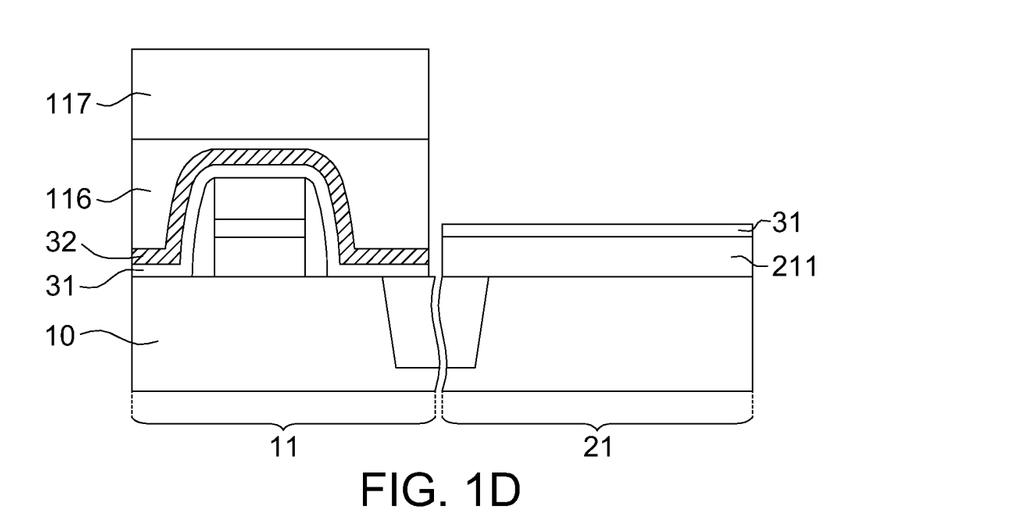

As shown in FIG. 1C, a first patterned BARC layer 116 is formed on the nitride HM film 32 in the first area 11, and a first patterned photo-resist (PR) 117 is formed on the first patterned BARC layer 116 in the first area 11 before depositing the first and second patterned passivations. As shown in FIG. 1D, the nitride HM film 32 in the second area 21 could be optionally removed before depositing the first and second patterned passivations. In another embodiment, the nitride HM film 32 in the second area 21 could be kept. Afterwards, the first patterned photo-resist (PR) 117 and the first patterned BARC layer 116 in the first area 11 are removed before deposition of the first and second patterned passivations.

Figure 1E:
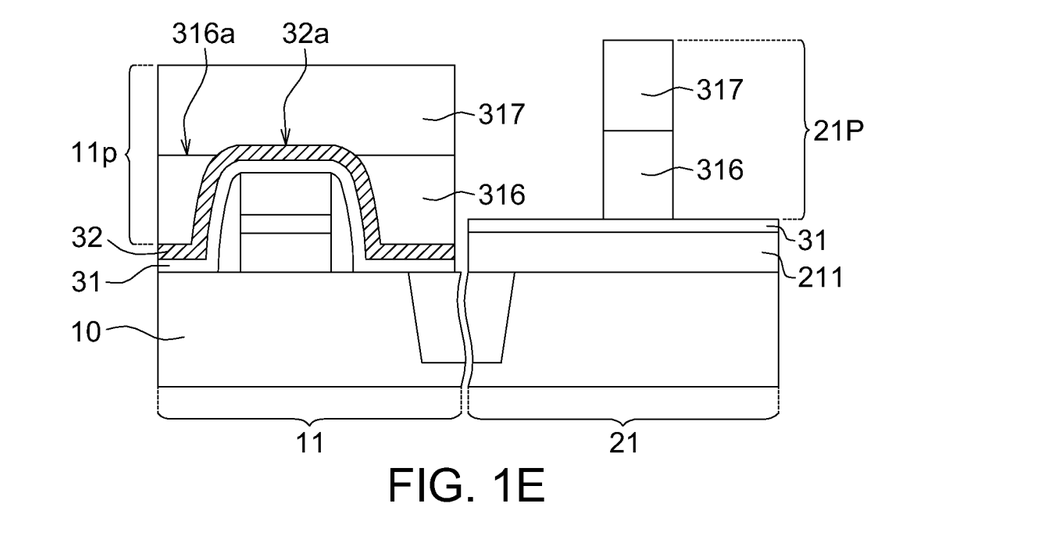

In one embodiment, the first and second patterned passivations could be, but not limited to, a patterned PR (ex: a second patterned photo-resist, PR2). In one embodiment, the first and second patterned passivations could be, but not limited to, a stack of a patterned PR on a patterned BARC (bottom anti-reflective coating) layer, which has been adopted in the first embodiment for illustration. As shown in FIG. 1E, the first patterned passivation 11P and the second patterned passivation 21P are formed in the first area 11 and the second area 21, respectively. Each of the first patterned passivation 11P and the second patterned passivation 21P includes a second patterned BARC layer 316 formed on the nitride HM film 32, and a second patterned photo-resist (PR) 317 formed on the second patterned BARC layer 316. Also, the first patterned passivation 11P and the second patterned passivation 21P are formed simultaneously. As shown in FIG. 1E, the second patterned BARC layer 316 in the first area 11 is formed on the nitride HM film 32, while the second patterned BARC layer 316 in the second area 21 is, not limitedly, formed on the oxide HM film 31.

According to the embodiments, a top surface 316a of the second patterned BARC layer 316 in the first area 11 could be lower than a top surface 32a of the nitride HM film 32, or substantially aligned to the top surface 32a of the nitride HM film 32, or higher than the top surface 32a of the nitride HM film 32. The disclosure has not particular limitation thereto. As shown in FIG. 1E, the top surface 316a of the second patterned BARC layer 316 lower than the top surface 32a of the nitride HM film 32 in the first area 11 is depicted for illustration.

Steps of defining the second poly layer 211 in the second area 21 by the second patterned passivation 21P according to the first embodiment are described below.

Figure 1F:
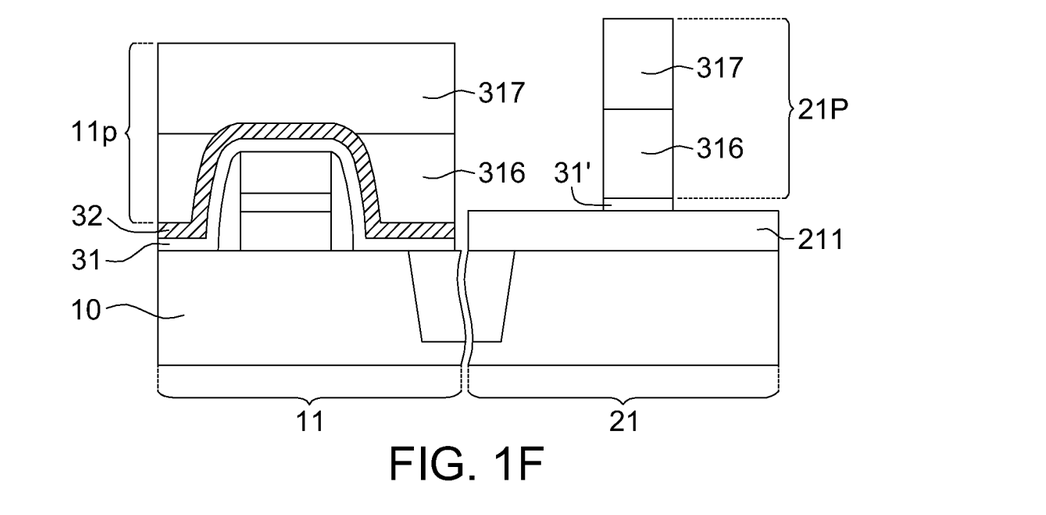

As shown in FIG. 1F, the oxide HM film 31 in the second area 21 is etched by the second patterned passivation 21P to form a patterned oxide HM 31'.

Figure 1G:
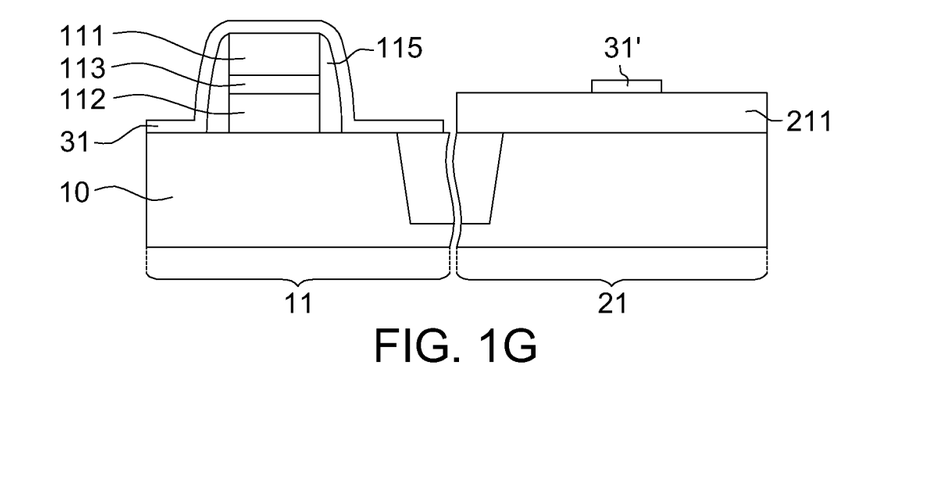

Afterwards, the first patterned passivation 11P and the second patterned passivation 21P (i.e. the second patterned BARC layer 316 and the second patterned PR 317) are removed; then the nitride HM film 32 in the first area 11 is removed, as shown in FIG. 1G. In one embodiment, the removal of the nitride HM film 32 in the first area 11 could be conducted by etching with hot $H_3PO_4$. Additionally, the critical dimension (CD) of the oxide HM film 31/the patterned oxide HM 31' could be adjusted and determined by considering the possible $H_3PO_4$ etching effect on the oxide HM (31/31') in practical application.

Figure 1H:
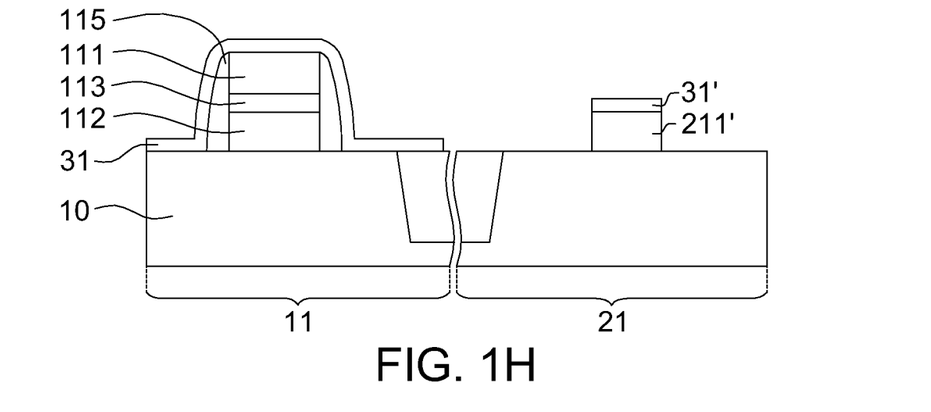
Figure 1I:
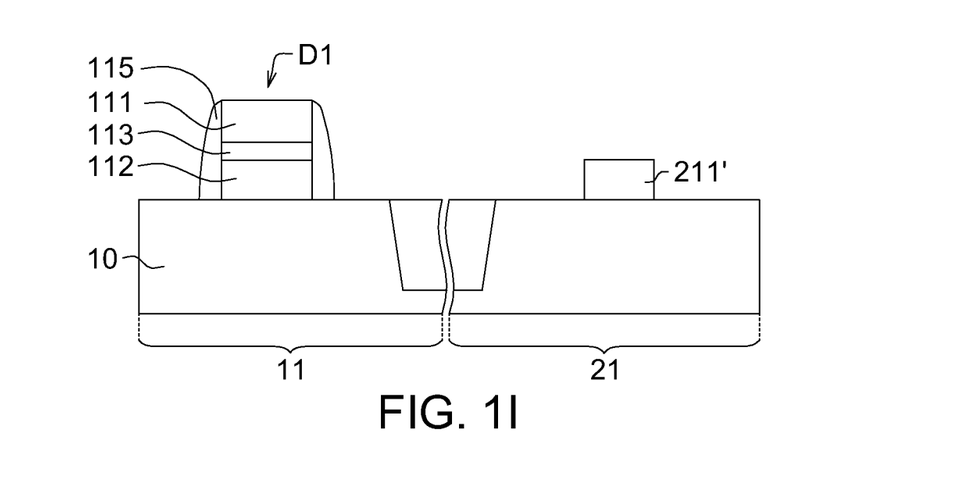

Poly etch in the second area 21 is conducted. As shown in FIG. 1H, the second polysilicon layer 211 in the second area 21 is etched by the patterned oxide HM 31' to form a patterned polysilicon layer 211'. As shown in FIG. 1I, the oxide HM film 31 in the first area 11 and the patterned oxide HM 31' in the second area 21 are removed.

Second Embodiment

The method for manufacturing a semiconductor device of the second embodiment is similar to that of the first embodiment. In the first embodiment, the nitride HM film 32 in the first area 11 is removed before procedures of logic poly etch; for example, before the second polysilicon layer 211 in the second area 21 being etched, as depicted from FIG. 1F~FIG. 1H. In the second embodiment, the nitride HM film 32 in the first area 11 is removed after procedures of logic poly etch.

FIG. 2A~FIG. 2F schematically illustrate a method for manufacturing a semiconductor device according to a second embodiment of the present disclosure. The identical elements of FIG. 2A~FIG. 2F and FIG. 1A~FIG. 1I are designated with the same reference numerals, and explanation of identical or similar part would not be repeated redundantly.

Figure 2A:
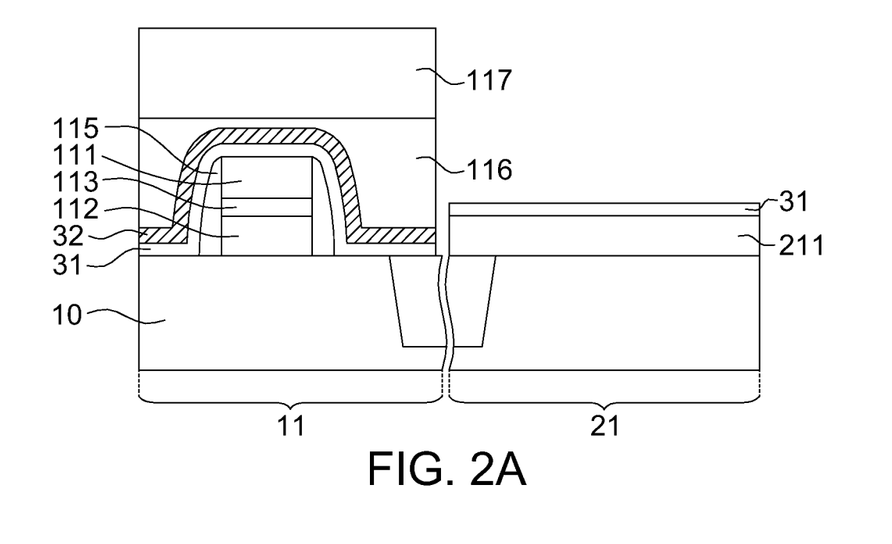
FIG. 2A~FIG. 2F schematically illustrate a method for manufacturing a semiconductor device according to a second embodiment of the present disclosure.

As shown in FIG. 2A, a substrate 10 having a first area 11 and a second area 21 is provided, and a first device D1 having a first polysilicon layer 111 is formed in the first area 11, while a second poly layer 211 is formed in the second area 21. In the second embodiment, a flash gate structure is depicted for being the first device D1 of the first area 11, which comprises an upper poly silicon layer (i.e. the first polysilicon layer 111) as a control gate, a lower poly silicon layer 112 as a floating gate, a dielectric layer 113 (ex: oxide layer) disposed between, and spacers 115 formed at sidewalls of the stack. As shown in FIG. 2A, the first poly layer 111 is higher than the second poly layer 211.

Also, an oxide hard mask (HM) film 31 is deposited on the first device D1 in the first area 11 and on the second poly layer 211 in the second area 21. A nitride HM film 32 is deposited on the oxide HM film 31, which covers the first poly layer 111 of the first device D1 in the first area 11 and the second poly layer 211 in the second area 21. The nitride HM film 32 on the second poly layer 211 is further optionally removed, as shown in FIG. 2A. In the first area 11, a first patterned BARC layer 116 formed on the nitride HM film 32 and a first patterned photo-resist (PR) 117 formed on the first patterned BARC layer 116 are further constructed before depositing the first and second patterned passivations. The details of element and procedures are similar to the descriptions of the first embodiment.

Figure 2B:
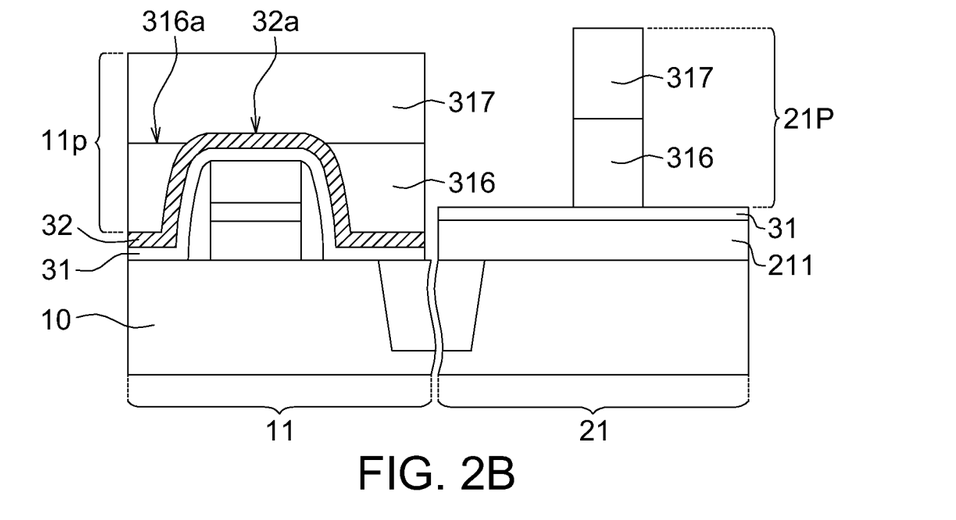

In the second embodiment, the first patterned passivation 11P and the second patterned passivation 21P are formed in the first area 11 and the second area 21, respectively. Each of the first patterned passivation 11P and the second patterned passivation 21P includes a second patterned BARC layer 316 formed on the nitride HM film 32, and a second patterned photo-resist (PR) 317 formed on the second patterned BARC layer 316, as shown in FIG. 2B. Also, the top surface 316a of the second patterned BARC layer 316 lower than the top surface 32a of the nitride HM film 32 in the first area 11 is depicted herein for illustration, but the disclosure has not particular limitation thereto.

Steps of defining the second poly layer 211 in the second area 21 by the second patterned passivation 21P according to the second embodiment are described below.

Figure 2C:
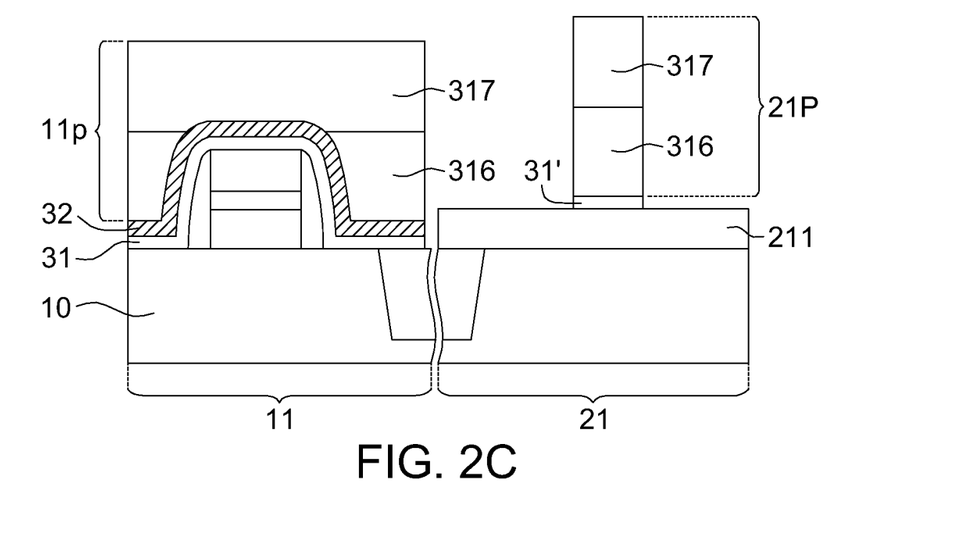

The oxide HM film 31 in the second area 21 is etched by the second patterned passivation 21P to form a patterned oxide HM 31', as shown in FIG. 2C.

Figure 2D:
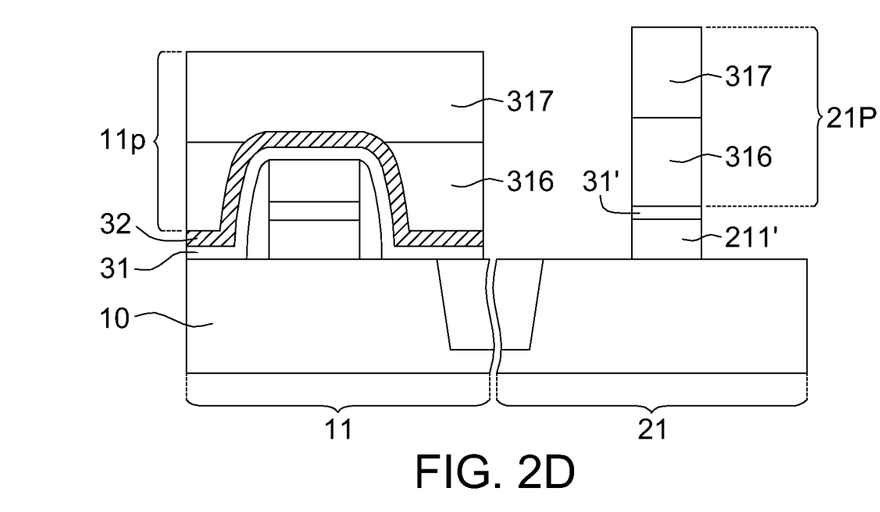

Then, the second polysilicon layer 211 in the second area 21 is etched by the stack of the second patterned passivation 21P and the patterned oxide HM 31' to form a patterned polysilicon layer 211', as shown in FIG. 2D.

Figure 2E:
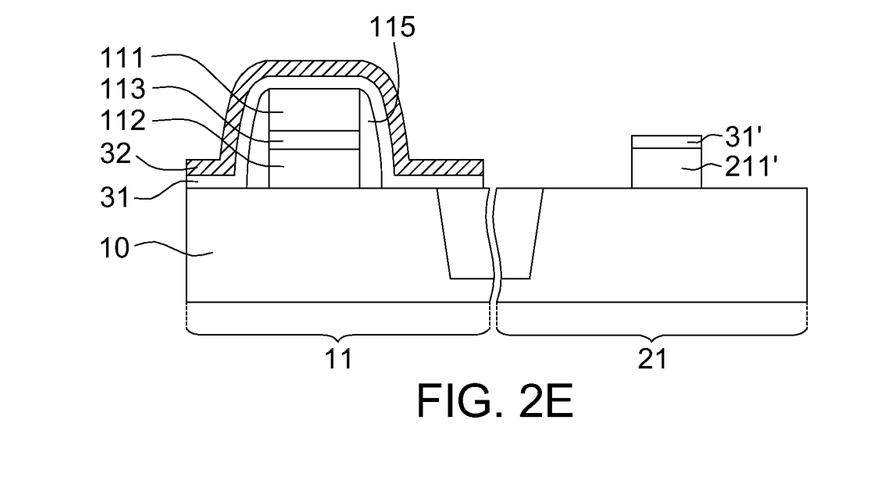

Afterwards, the first patterned passivation 11P in the first area 11 and the second patterned passivation 21P in the second area 21 (i.e. the second patterned BARC layer 316 and the second patterned PR 317) are removed, as shown in FIG. 2E.

Figure 2F:
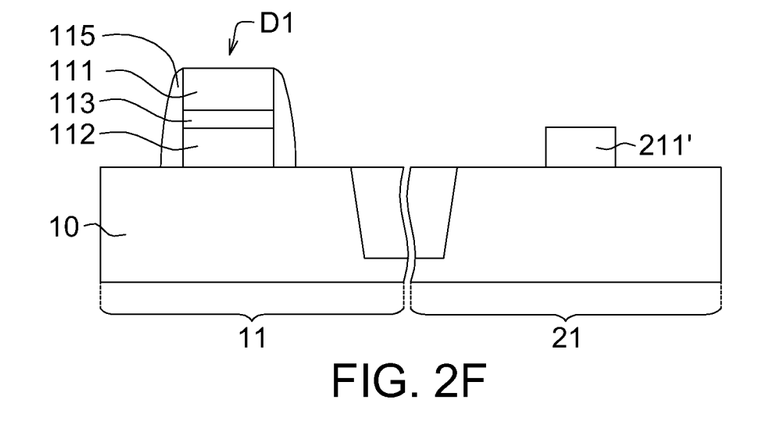

Then, the nitride HM film 32 in the first area 11 is removed, followed by removal of the oxide HM film 31 in the first area 11 and the patterned oxide HM 31' in the second area 21, as shown in FIG. 2F. In one embodiment, the removal of the nitride HM film 32 in the first area 11 could be conducted by etching with hot $H_3PO_4$. In the second embodiment, the patterned polysilicon layer 211' in the second area 21 is protected by the patterned oxide HM 31', therefore, it would be less damaged during the etching of the nitride HM film 32.

According to the aforementioned descriptions, a method for manufacturing a semiconductor device with deposition of a nitride HM film is provided for protecting the first device in a first area from being damaged in the subsequent procedures; for example, poly define procedures in the second area. The present disclosure could be applied to a substrate having at least two devices with different step height profiles. As depicted in the embodiments, the upper poly (i.e. the first polysilicon layer 111) of the first device D1 in the first area 11 is higher than the second polysilicon layer 211 (of a second device) in the second area 21. According to the embodiments of the disclosure, the first device (such as flash gate) in the first area could be effectively protected by the nitride HM film in the manufacturing procedures. Conventionally, in order to avoid the upper poly damage of the first device during etching process, the first BARC litho and the second BARC litho process are adopted, and the first BARC is required to be remained on the polysilicon in the first area for the protection purpose, thereby causing the adhesion issue between the first BARC layer and the second BARC layer. According to the embodiments of the disclosure, it is no need to keep the first BARC layer. Also, use of the nitride (ex: SiN or SiCN, or combination thereof) HM film 32 is able to solve the adhesion issue at the interface between the first and second BARC layers. Therefore, the yield and electrical characteristics of the device manufactured using the method of the present disclosure could be greatly improved consequently.

Other embodiments with different configurations of the first and second devices are also applicable, which could be varied depending on the actual needs of the applications. It is, of course, noted that the configurations of FIG. 1A-FIG. 1I and FIG. 2A~2F are depicted only for demonstration, not for limitation. It is known by people skilled in the art that the steps of method could be adjusted according to the requirements and/or manufacturing methods of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
    providing a substrate having a first area with a first poly layer and a second area with a second poly layer;
    forming an oxide hard mask film on the first device in the first area and the second poly layer in the second area;
    depositing a nitride hard mask film above the oxide hard mask film on the first poly layer of a first device in the first area and above the second poly layer in the second area;
    removing the nitride hard mask film in the second area;
    forming a first patterned passivation on the nitride hard mask film in the first area to cover the nitride hard mask film and the first device, and forming a second patterned passivation directly on the oxide hard mask film above the second poly layer in the second area; and
    defining the second poly layer in the second area by the second patterned passivation.

2. The method according to claim 1, wherein steps of defining the second poly layer comprises:
    etching the oxide hard mask film in the second area by the second patterned passivation to form a patterned oxide hard mask;
    removing the first patterned passivation and the second patterned passivation;
    removing the nitride hard mask film in the first area;
    etching the second poly layer in the second area by the patterned oxide hard mask; and
    removing the patterned oxide hard mask.

3. The method according to claim 1, wherein steps of defining the second poly layer comprises:
    etching the oxide hard mask film in the second area by the second patterned passivation to form a patterned oxide hard mask in the second area;
    etching the second poly layer in the second area by a stack of the second patterned passivation and the patterned oxide hard mask to form a patterned second poly;
    removing the first patterned passivation and the second patterned passivation;
    removing the nitride hard mask film in the first area; and
    removing the oxide hard mask film in the first area and the patterned oxide hard mask in the second area.

4. The method according to claim 1, wherein the first poly layer and the second poly layer have different heights.

5. The method according to claim 1, wherein the first and second patterned passivations are formed simultaneously.

6. The method according to claim 1, wherein each of the first and second patterned passivations is a patterned photoresist.

7. The method according to claim 1, wherein the nitride hard mask film comprises SiN, SiCN, or a combination thereof.

8. The method according to claim 1, wherein steps before forming the first and second patterned passivations further comprising:
    forming a first patterned bottom anti-reflective coating layer on the nitride hard mask film in the first area; and
    forming a first patterned photo-resist on the first patterned bottom anti-reflective coating layer in the first area.

9. The method according to claim 8, further comprising:
    removing the first patterned photo-resist and the first patterned bottom anti-reflective coating layer.

10. The method according to claim 1, wherein each of the first and second patterned passivations is a patterned photo-resist stacked on a patterned bottom anti-reflective coating layer.

11. The method according to claim 10, wherein a top surface of the patterned bottom anti-reflective coating layer is lower than a top surface of the nitride hard mask film in the first area.

12. The method according to claim 10, wherein a top surface of the patterned bottom anti-reflective coating layer is higher than a top surface of the nitride hard mask film in the first area.

13. The method according to claim 10, wherein a top surface of the patterned bottom anti-reflective coating layer is substantially aligned to a top surface of the nitride hard mask film in the first area.

* * * * *